United States Patent
Derbyshire et al.

(10) Patent No.: US 6,908,572 B1
(45) Date of Patent: Jun. 21, 2005

(54) MIXING AND DISPERSION OF NANOTUBES BY GAS OR VAPOR EXPANSION

(75) Inventors: Francis J. Derbyshire, deceased, late of Lexington, KY (US); by Rosemary Derbyshire, legal representative, Lexington, KY (US); Rodney Andrews, Lexington, KY (US); Bouchra Safadi, Lyons (FR)

(73) Assignee: University of Kentucky Research Foundation, Lexington, KY (US)

( * ) Notice: Subject to any disclaimer, the term of this patent is extended or adjusted under 35 U.S.C. 154(b) by 540 days.

(21) Appl. No.: 09/906,955

(22) Filed: Jul. 17, 2001

Related U.S. Application Data
(60) Provisional application No. 60/218,631, filed on Jul. 17, 2000.

(51) Int. Cl.$^7$ .............................. H01B 1/18; H01B 1/24; B32B 5/02; B32B 27/24
(52) U.S. Cl. ...................... 252/502; 252/500; 428/367; 428/634; 428/922
(58) Field of Search ................................ 252/502, 500; 428/367, 634, 922; 204/164; 264/309; 516/901; 106/38.28

(56) References Cited

U.S. PATENT DOCUMENTS

| | | | |
|---|---|---|---|
| 5,424,054 A | 6/1995 | Bethune et al. | |
| 5,853,877 A | 12/1998 | Shibuta | |
| 5,908,585 A | * 6/1999 | Shibuta | ...................... 252/506 |
| 6,159,742 A | * 12/2000 | Lieber et al. | ............... 436/164 |
| 6,346,023 B1 | * 2/2002 | Tsuboi et al. | ................. 445/46 |

OTHER PUBLICATIONS

Liu et al, : Fullerene Pipes, Sci. 1998, 280, pp 1253–1256.*
Liu J., et al., Fullerene Pipes. Science 280: 1253–1255 (1998).
Mallick, P. K., Fiber Reinforced Composites, (2d ed. 1993), pp 73–74, Marcel Decker, New York, NY.

* cited by examiner

*Primary Examiner*—Mark Kopec
*Assistant Examiner*—Kallambella Vijayakumar
(74) *Attorney, Agent, or Firm*—King & Schickli, PLLC

(57) ABSTRACT

Novel methods and compositions for coating target surfaces with non-entangled multi-wall carbon nanotubes are disclosed. In one aspect, the methods and compositions of the invention comprise dispersion of non-entangled multi-wall carbon nanotubes in solvent, and application of the non-entangled multi-wall carbon nanotube/solvent mixture to a surface by spraying. In another aspect, the methods and compositions of the invention comprise dispersion of non-entangled multi-wall carbon nanotubes in solvent, and applying the nanotube/solvent mixture to a suitable matrix by spraying to form a surface coating which is substantially contiguous with the surface of the matrix. The compositions of the invention are substantially free of metal oxides and sulfur, and do not require harsh oxidative treatments.

25 Claims, 3 Drawing Sheets

FIGURE 2a
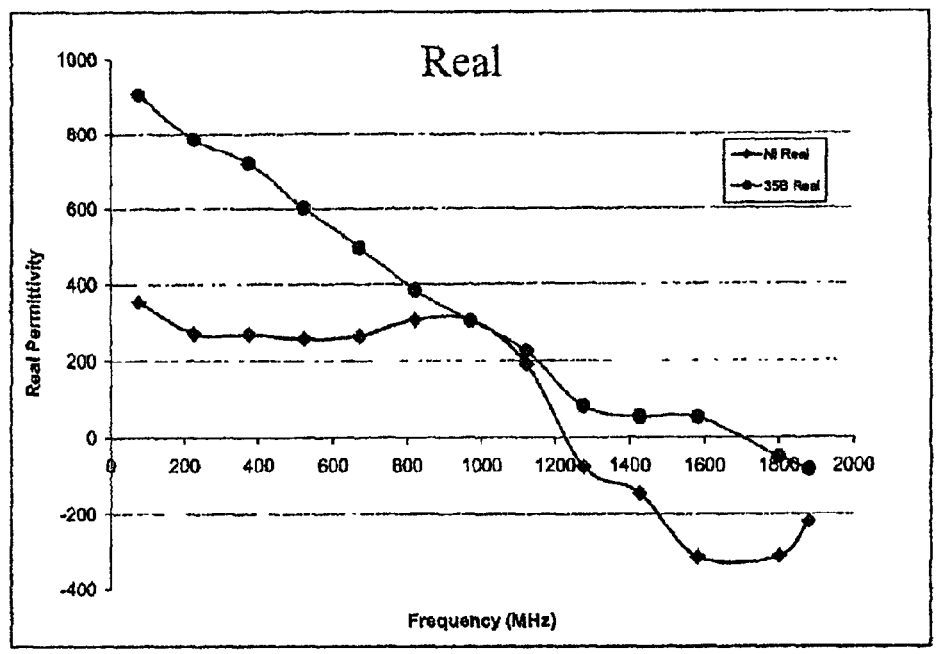
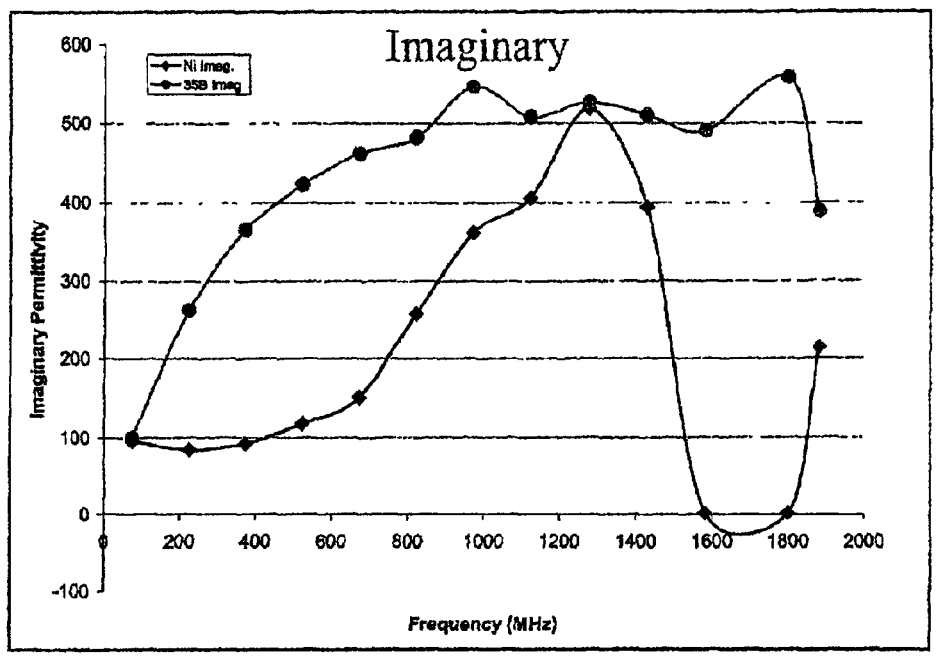
FIGURE 2b

MIXING AND DISPERSION OF NANOTUBES BY GAS OR VAPOR EXPANSION

This application claims the benefit of U.S. Provisional Patent Application Ser. No. 60/218,631 filed Jul. 17, 2000.

This invention was made with Government support under NSF-MRSEC grant DMR-9809686. The Government may have certain rights in this invention.

TECHNICAL FIELD

The present invention relates to surface coatings containing carbon nanotubes, and more particularly to methods for coating substrates with non-entangled multi-walled carbon nanotubes. The invention further relates to compositions containing non-entangled multi-walled carbon nanotubes for coating substrates. The compositions of the invention are substantially free of metal oxides and sulfur, and do not require harsh oxidative treatments.

BACKGROUND OF THE INVENTION

Currently utilized technologies for providing protective coatings, such as electromagnetic interference shielding, can be divided into 2 categories: a) metallic shields or casings; and b) thin metal coatings. The metallic shields or casings are formed metal parts that sit over specific electrical components to be shielded. Alternatively, larger metal parts may be used to cover the entire electronic circuitry involved. Extra processing steps are required in the manufacturing of such metal parts, often requiring a complicated geometry for smaller single component shields. The larger metallic shields which cover the entire electronics boards are simpler to manufacture and install, but increase the weight of the completed electronic device. In either case, additional costs are added to the manufacturing process for the cost of the metal, fabrication to the desired shape, and mounting in the electronic device.

An alternative approach, which is currently used instead of separate metallic shielding, is to spray a thin coating of metal particles onto the interior surface of the casing of the electronic device. This material, which can be applied in a similar fashion to paint, contains very fine metallic particles (typically nickel) which form a shielding layer. The metal particles must be extremely fine to allow spraying, and hence, the coating is costly. Also, the metallic film must be of uniform thickness and adhere well to the substrate onto which it is sprayed in order to allow sufficient percolation to adequately shield. The major disadvantage with sprayed metallic coatings is that the usually plastic casing of the electronic device is rendered non-recyclable. The nickel (or other metal) which must be intimately bonded to the casing of the electronic device to assure sufficient EMI shielding prevents recycling of the plastic casing, as the metal will degrade the plastic if recycling is attempted.

It is known in the art to utilize small, high aspect ratio conducting Acylinders such as carbon microfibrils or nanotubes as coatings or in dispersion to fabricate electromagnetic shielding materials. For example, U.S. Pat. No. 5,853,877 to Shibuta discloses treatment of carbon microfibril agglomerates with sulfur-containing strong acids such as sulfuric acid and an oxidizing agent such as nitric acid, to disentangle the nanotubes prior to dispersion in polar solvents, for use in forming transparent electrically conductive films. This disentangling step by treatment with sulfur-containing strong acids and oxidizing agents is specifically required in the Shibuta process to allow formation of an electrically conductive film of sufficient transparency.

Similarly, U.S. Pat. No. 5,908,585 to Shibuta discloses transparent electrically conductive films comprising 0.01%–1 wt. % of hollow carbon microfibers and 1%–40 wt. % of an electrically conductive metal oxide powder. The inclusion of relatively high percentages of metal oxide is required in the method of the '585 patent to allow suitable levels of electrical conductivity without impairing the transparency of the electrically conductive films created thereby by high concentrations of carbon microfibers.

The electrically conductive films described in the '877 and '585 patents to Shibuta are generally effective for their intended purposes. However, the films suffer from certain disadvantages. In the '877 patent, sulfur-containing strong acids and oxidizing agents are required to disentangle the carbon microfibers to form a suitable electrically conductive film. Accordingly, separate disentangling and dispersion steps are required prior to coating the desired surface with the electrically conductive film of the '877 patent. Further, the harsh oxidative treatment required to disentangle the carbon microfibrils alters the surface characteristics and chemistry of the microfibrils. Specifically, such treatment of carbon microfibrils is known to shorten them, reducing the aspect ratio, and thereby requiring increased amounts of microfibrils in a composition to reach a particular percolation threshold (Liu J., Rinzler A. G., Dai H., Hafner J. H., Bradley R. K., Boul P. J., Lu A., Iverson T., Shelimov K., Huffman C. B., Rodriguez-Macias F., Shon Y.-S., Lee T. R., Colbert D. T., Smalley R. E. (1998) Fullerene pipes. *Science* 280: 1253–1255; incorporated herein by reference). This use of increased quantities of relatively expensive microfibrils to achieve a predetermined percolation threshold substantially increases the production costs of this approach.

Inclusion of metal oxide powders in the compositions of the '585 patent is necessary to impart the desired electrical conductivity to the final product. Addition of metal oxide powder such as antimony-doped tin oxide, however, may render any plastic coated with the composition unsuitable for recycling, and further adds significant cost to the process. The metal oxide powder also weakens the resulting thin film, as the oxide acts as an inert filler within the film. This type of filler reduces the mechanical properties of the film compared to, for example, inclusion of carbon nanotubes alone (P. K. Mallick, 1993. "Fiber Reinforced Composites." (2d edition), Marcel Dekker, New York, N.Y.; incorporated herein by reference).

Accordingly, there is a need in the art for carbon nanotube-based compositions suitable for use as surface coatings for desired target surfaces or substrates which do not require harsh chemical treatments to allow disentangling and dispersion of the nanotubes. There is further a need in the art for such compositions which do not require the addition of weakening metal oxide fillers to achieve suitable levels of electrical conductivity, and which do not inhibit recycling of the plastic components of electronic devices to which the compositions are applied.

SUMMARY OF THE INVENTION

In accordance with the purposes of the present invention as described herein, novel methods for coating target surfaces with non-entangled multi-walled carbon nanotubes (NE-MWNTs) are provided. Advantageously, the present invention allows the separation/dispersion of NE-MWNTs and coating of a target surface to be combined into a single, one-step process. In one aspect, the method comprises dispersing NE-MWNTs in a solvent, applying the non-entangled multi-walled carbon nanotubes dispersed in solvent to a target surface, and evaporating the solvent. The NE-MWNTs of this invention are non-entangled as synthesized, eliminating the need for a separate disentanglement step as is required in the Shibuta patents. Solvents useful in the methods of the instant invention may include, but are not limited to, polar organic solvents, nonpolar organic solvents, alcohols, polymeric resins, halogen-substituted organic solvents, or mixtures thereof.

The NE-MWNTs and the solvents useful for the present invention are substantially free of metal oxide, resulting in a stronger coating with improved mechanical properties. The NE-MWNTs and the solvent of the present invention are also substantially free of sulfur and are not subjected to harsh oxidative treatments, resulting in a coating requiring decreased concentrations of NE-MWNTs to achieve the desired shielding properties. In one embodiment, the NE-MWNTs have an aspect ratio of from about 10 to about 50,000. In a preferred embodiment, the NE-MWNTs have an aspect ratio of from about 500 to about 10,000. In a particularly preferred embodiment, the NE-MWNTs have an aspect ratio of from about 1000 to about 5000. The diameter of the NE-MWNTs useful in the methods of the present invention may range from about 3.5 nanometers to about 200 nanometers. In an especially preferred embodiment, the diameter of the NE-MWNTs useful in the methods of the present invention may range from about 20 nanometers to about 40 nanometers.

The NE-MWNTs of this invention may be dispersed by any of a number of means. In a preferred embodiment, the NE-MWNTs are dispersed by entrainment into the solvent using an expansion means such as a mister, a nozzle, an eductor, or a venturi, and sprayed directly onto the surface of the desired substrate or device to be coated. Coating thickness is determined by the number of spraying passes, and may be adjusted as desired to achieve the desired coating thickness or ESI shielding level. Uniform coating of the desired surface is achieved by merely allowing the solvent to evaporate. In situations where more rapid evaporation is desirable, the solvent may be flash-evaporated by methods commonly known in the art as it is expanded onto the target surface.

In another preferred embodiment of the methods of this invention, a desired substrate may be coated with NE-MWNTs by entraining them into a gas carrier stream, creating an aerosol of the NE-MWNTs in the gas carrier stream by any of a number of known prior art methods, and spraying the aerosol onto the desired target surface. The gas carrier stream may be any suitable gas, such as hydrogen, argon, or an inert gas. In a preferred embodiment, the carrier is air.

It will be appreciated by those skilled in this art that by careful selection of the carrier solvent in view of the physical and chemical properties of the substrate to be coated, it is possible to make the sprayed-on coatings of this invention substantially contiguous with the substrate's surface. Specifically, solvents are selected in view of the substrate or matrix to be coated which soften and partially solubilize the surface layer of the matrix to allow actual chemical interactions between the NE-MWNT/solvent mixture and the matrix to form a substantially contiguous nanotube coating.

Thus, in yet another aspect, this invention provides a method for coating a desired target surface with NE-MWNTs comprising simultaneously: (1) dispersing NE-MWNTs in a solvent and (2) applying the NE-MWNTs/solvent mixture to the target matrix surface to form a substantially contiguous coating. As noted supra, the NE-MWNTs, solvent, and matrices are substantially free of metal oxide and sulfur, and may be selected from the ranges of aspect ratios and diameters noted above. Suitable solvents for this method include, but are not limited to, polar organic solvents, nonpolar organic solvents, alcohols, polymeric resins, halogen-substituted organic solvents, or mixtures thereof. The matrices suitable for the methods of this invention include, but are not limited to, polymers, glasses, ceramics, metals, or mixtures thereof. The NE-MWNT/solvent mixtures of this method may be applied to a desired matrix surface by spraying.

In still yet another aspect of the instant invention, a composition is provided, suitable as a coating substance in accordance and produced in accordance with the methods described above, comprising NE-MWNTs dispersed in a solvent. As noted supra, the NE-MWNTs and solvents useful in the compositions of the present invention are substantially free of metal oxides and sulfur. Aspect ratios and diameters of the NE-MWNTs useful for the compositions of the present invention may be selected from the ranges described supra. The solvents may be selected from the group comprising polar organic solvents, nonpolar organic solvents, alcohols, polymeric resins, halogen-substituted organic solvents, or mixtures thereof, and may be selected in view of the surfaces to be coated to result in a NE-MWNT coating that is substantially contiguous with the surface of the substrate.

In still yet another aspect of this invention, a surface coating for a substrate is provided, produced in accordance with the method as described above, comprising non-entangled multi-walled carbon nanotubes which are substantially free of metal oxides and sulfur. In a preferred embodiment, the surface coating comprises non-entangled multi-walled carbon nanotubes at a density of from about 10 to about 10,000 mg/m$^2$. In a particularly preferred embodiment, the surface coating of this invention comprises non-entangled multi-walled carbon nanotubes at a density of up to 100 mg/m$^2$. In a particularly preferred embodiment, the surface coating of the invention has a surface resistivity of up to $10^5$ Ω/square.

In still yet another aspect of the invention, a surface coating for a substrate is provided, produced in accordance with the methods as described above, comprising non-entangled multi-walled carbon nanotubes substantially contiguous with a matrix, wherein the non-entangled multi-walled carbon nanotubes are substantially free of metal oxides and sulfur. In a preferred embodiment, the surface coating comprises non-entangled multi-walled carbon nanotubes at a density of from about 10 to about 10,000 mg/m$^2$. In a particularly preferred embodiment, the surface coating of this invention comprises non-entangled multi-walled carbon nanotubes at a density of up to 100 mg/m$^2$. In a particularly preferred embodiment, the surface coating of the invention has a surface resistivity of up to $10^5$ Ω/square. Suitable matrices may be selected from the group including polymers, glasses, ceramics, metals, or mixtures thereof.

The methods and compositions of the present invention as described herein are useful in numerous commercial fields, such as for electromagnetic interference (EMI) shielding applications (for example, for cellular telephones), static control, or any application where a conductive layer on an insulating base is required. The methods and compositions described herein are also useful in thermal conduction and waste heat management, such as in backings for optics where "hot spots" may develop. The methods and compositions of the invention may be used to create other types of protective coatings, such as for conferring resistance to ultraviolet radiation. The methods and compositions of this invention are useful also in creating structured forms, such as for example in producing vessel liners wherein NE-MWNT-containing materials provide static control and anti-corrosive properties. The compositions of this invention may also be used for wear coatings and lubricants. The methods of the invention are also useful for applications requiring dispersion and pre-mixing of nanotubes prior to formation of composites, and for creation of thin coatings of sprayed NE-MWNTs onto desired surfaces to provide a "primer" prior to electrostatic painting.

Other objects and applications of the present invention will become apparent to those skilled in this art from the following description wherein there is shown and described a preferred embodiment of this invention, simply by way of illustration of the modes currently best suited to carry out the invention. As it will be realized, the invention is capable of other different embodiments and its several details are capable of modification in various, obvious aspects all without departing from the invention. Accordingly, the drawings and descriptions will be regarded as illustrative in nature and not as restrictive.

BRIEF DESCRIPTION OF THE DRAWING

The accompanying drawing incorporated in and forming a part of the specification illustrates several aspects of the present invention and, together with the description, serves to explain the principles of the invention. In the drawing:

FIGS. 2a and 2b show complex permittivity of the sprayed NE-MWNT coatings of the present invention when applied to an acrylonitrile-butadiene-styrene (ABS) matrix at an approximate surface concentration of NE-MWNTs of less than 5 mg/m$^2$: (a) Real permittivity; (b) Imaginary permittivity.

Reference will now be made in detail to the presently preferred embodiments of the invention, examples of which are illustrated in the accompanying drawing.

DETAILED DESCRIPTION OF THE INVENTION

As summarized above, the present invention relates to novel methods and compositions for coating target surfaces with non-entangled multi-walled carbon nanotubes (NE-MWNTs). The methods and compositions of the present invention may be accomplished by various means which are illustrated in the examples below. These examples are intended to be illustrative only, as numerous modifications and variations will be apparent to those skilled in the art.

In one aspect, the method comprises dispersing non-entangled multi-walled carbon nanotubes (NE-MWNTs) in a solvent, applying the non-entangled multi-walled carbon nanotubes dispersed in solvent to a target surface by, for example, spraying, and evaporating the solvent. The NE-MWNTs of this invention are non-entangled as produced, eliminating the need for a separate disentanglement step. Expansion of solvent surrounding the NE-MWNTs and any which may have adsorbed between clusters of NE-MWNTs then separates the NE-MWNTs into smaller groupings or individual nanotubes, effectively dispersing the nanotubes onto a target surface, into a vessel, or into a process stream as desired.

Non-entangled multi-walled carbon nanotubes useful in the methods and compositions of the present invention may be synthesized in accordance with any appropriate method known in the art and utilizing any known catalyst and carbon source, such as catalytic decomposition of a ferrocene-xylene mixture (Andrews R., Jacques D., Rao A. M., Derbyshire F., Qian D., Fan X, et al. (1999) Continuous production of aligned carbon nanotubes: a step closer to commercial realization. Chem. Phys. Lett. 303:467, incorporated herein by reference). Briefly, a suitable catalyst such as ferrocene is mixed with a carbon source such as xylene and catalytically decomposed on a substrate such as quartz in a suitable reactor at a temperature above volatilization in accordance with known methods.

The NE-MWNTs suitable for the methods and compositions of this invention may be synthesized in a batch process as is known in the art, or alternatively in a continuous process as described in U.S. patent application Ser. No. 10/141,423 entitled Process for the Continuous Production of Aligned Carbon Nanotubes, incorporated herein by reference.

EXAMPLE 1

Figure 1:
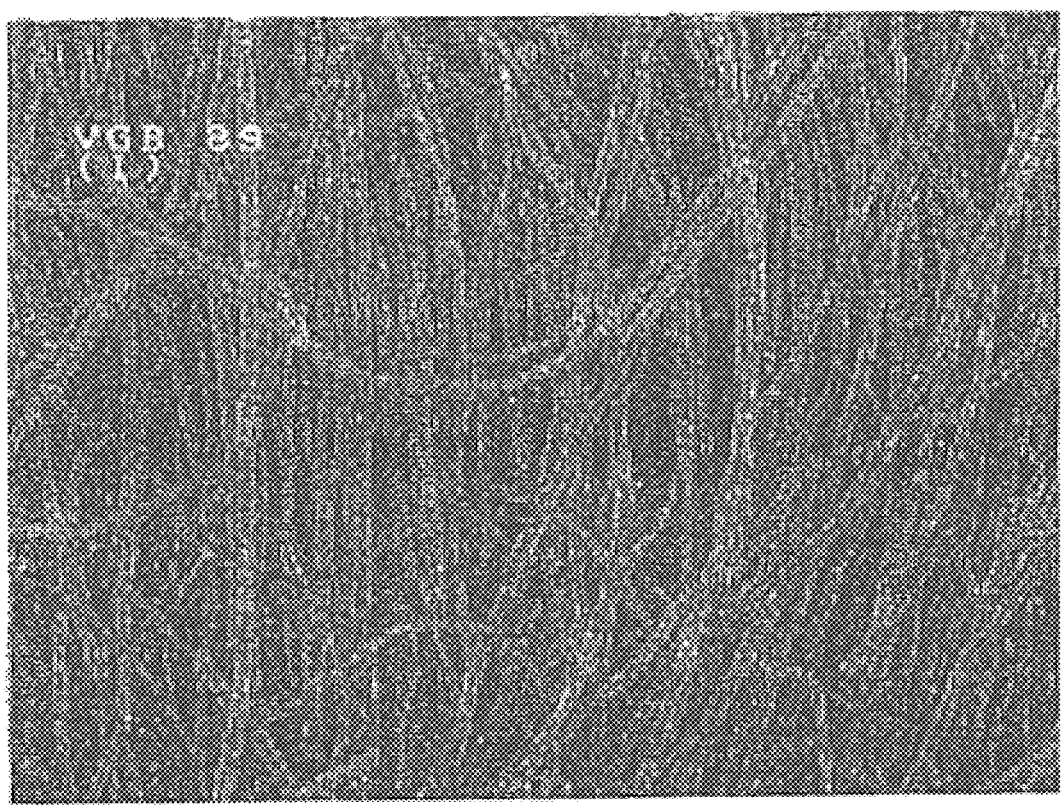
FIG. 1 shows a scanning electron microscope image of the highly pure, highly aligned NE-MWNTs of the present invention.

In brief, aligned multi-walled carbon nanotubes were grown on a quartz substrate in a reactor. The catalyst/carbon source mixture was introduced into the reactor by injection through a flow of inert gas (to exclude oxygen). The product may be recovered from the quartz substrates by mechanical means. As seen in FIG. 1, the process resulted in a high purity, highly aligned multiwalled carbon nanotube product.

In one embodiment, the NE-MWNTs have an aspect ratio of from about 10 to about 50,000. In a preferred embodiment, the NE-MWNTs have an aspect ratio of from about 500 to about 10,000. In a particularly preferred embodiment, the NE-MWNTs have an aspect ratio of from about 1000 to about 5000. The diameter of the NE-MWNTs useful in the methods of the present invention may range from about 3.5 nanometers to about 200 nanometers. In an especially preferred embodiment, the diameter of the NE-MWNTs useful in the methods of the present invention may range from about 20 nanometers to about 40 nanometers.

The aspect ratio and diameter of the NE-MWNTs may be varied by any known means in accordance with the desired aspect ratio/diameter for the desired application. For example, using tubing of differing inner diameter (ID) for the injector which introduces the catalyst/carbon source into the reactor may control the average diameter and diameter distribution of the product nanotubes. Smaller (for example, capillary tubing) ID tubing results in finer atomization of the feed and catalyst and therefore results in thinner diameter nanotubes. Wider ID tubing has the converse effect. Thus, varying the inner diameter of the injector tubing used allows selective variation of the diameter distribution and, accordingly, the aspect ratio for the end product.

As noted, the NE-MWNTs and the solvent of the present invention are substantially free of metal oxide, allowing synthesis of a coating material with improved mechanical properties. The NE-MWNTs and the solvent of the present invention are also substantially free of sulfur and are not subjected to harsh oxidative treatments. Thus, the NE-MWNTs are not shortened by oxidation reaction. As a consequence, the coating materials synthesized therefrom require decreased concentrations of NE-MWNTs to achieve the desired, e.g., shielding properties.

Solvents useful in the methods and compositions of the instant invention may include, but are not limited to, polar organic solvents, nonpolar organic solvents, alcohols, polymeric resins, halogen-substituted organic solvents, or mixtures thereof. Specific examples of solvents include, but are not limited to, toluene, xylene, benzene, acetone, ethanol, methanol, DMSO, DMF, DMAc, MEEK, THF, urethane, low molecular weight epoxies, quinolone, and trifluoroethanol.

In a preferred embodiment of the invention, NE-MWNTs are dispersed in solvent by entrainment using an expansion means such as a nozzle, mister, eductor, venturi, or the like. In an especially preferred embodiment of the methods of this invention, a desired substrate may be coated with NE-MWNTs by entraining the NE-MWNT/solvent mixture into a gas carrier stream, thereby creating an aerosol of the NE-MWNT/solvent mixture in the gas carrier stream, and spraying the aerosol onto the desired target surface. The gas carrier stream may be any suitable gas, such as hydrogen, argon, or any inert gas or mixture of inert gases. In a preferred embodiment the carrier gas is air. The NE-MWNT/solvent mixture may be entrained into the gas stream by any known device as described above. As will be appreciated by those skilled in the art, the fractional percentage of carbon in the nanotube layer applied by the methods of this invention will not significantly affect the processability (and therefore recyclability) of, for example, a plastic piece to which it is applied.

EXAMPLE 2

In this example, coating of a desired substrate with the NE-MWNT-containing compositions of this invention is demonstrated. The method described in this example comprises the steps of:

1. Dispersing NE-MWNTs in solvent (10 mg NE-MWNT/100 ml ethanol). Dispersion may be achieved by mechanical mixing or sonication.
2. Starting air flow through the eductor.
3. Feeding the NE-MWNT/solvent mixture to the suction port on the eductor, either manually or through tubing.
4. Applying the discharge from the eductor to the target surface. As the gas/liquid mixture expands out of the nozzle of the eductor, it becomes an aerosol that can be used to spray a thin coating of the NE-MWNT/solvent mixture onto the target surface.
5. Allowing the solvent to partially evaporate between applications of coatings of the NE-MWNT/solvent mixture of this invention.

As described above, uniform coating of the desired surface may be On achieved by merely allowing the solvent to evaporate. In situations where more rapid evaporation is desirable, the solvent may be flash-evaporated by methods commonly known in the art as it is expanded onto the target surface. Coating thickness is determined by the number of spraying passes, and may be adjusted as desired to achieve the desired coating thickness, surface conductivity, or EMI shielding level depending on the desired application.

As is known in the art, selecting an appropriate carrier solvent in accordance with the desired target substrate matrix allows the NE-MWNT/solvent coating, upon application to the desired target surface, to be made contiguous with, e.g., the bulk plastic of the casing of an electronic device. A more complete listing of suitable solvents for particular polymers may be found in Bloch D. R. (1999) "Solvents and Non-Solvents for Polymers," Polymer Handbook, 4$^{th}$ Ed. (Brandrup, Immergut, and Grulke, Eds.), New York, Wiley. It will be appreciated that the selection of suitable solvent/substrate combinations will be guided by the physical and chemical nature of the target matrix to which the NE-MWNT/solvent mixture is to be bonded. The end result of selecting the solvent in view of the matrix to be coated is that the solvent softens and partially solubilizes the matrix, allowing an actual chemical interaction between the NE-MWNT/solvent mixture and the matrix, thereby forming nanotube coating which is substantially contiguous with the surface of the matrix.

Thus, in yet another aspect, this invention provides a method for coating a desired target surface with NE-MWNTs comprising the steps of: (1) dispersing NE-MWNTs in a solvent and (2) applying the NE-MWNTs/solvent mixture to the target matrix surface to form a substantially contiguous coating. As discussed supra, selecting an appropriate carrier solvent allows this NE-MWNT/solvent coating, upon application to the desired target surface, to be made contiguous with, e.g., bulk plastic of the casing of an electronic device. The selection of solvent will be dictated by the physical properties of the matrix to which the nanotube-containing surface coating is applied.

As noted supra, the NE-MWNTs and solvents are substantially free of metal oxide and sulfur, and may be selected from the ranges of aspect ratios and diameters noted above. Suitable solvents for this embodiment of the method of the invention have been described supra. The classes of matrices suitable for the methods of this invention include, but are not limited to, polymers (including thermoplastic polymers, thermosetting polymers, and rubbers), glasses, ceramics, metals, or mixtures thereof. Specific examples include polyolefins, polyesters, polycarbonates, borosilicate glass, quartz, mineral glasses, conductive glasses, silicates, alumina, zirconia, and the like.

In still yet another aspect of the instant invention, a composition is provided for coating a surface with nanotubes comprising NE-MWNTs dispersed in a solvent. As noted supra, the NE-MWNTs and solvents useful in the compositions of the present invention are substantially free of metal oxides and sulfur. Aspect ratios and diameters of the NE-MWNTs useful for the compositions of the present invention may be selected from the ranges described supra. The solvents may be selected from the group comprising polar organic solvents, nonpolar organic solvents, alcohols, polymeric resins, halogen-substituted organic solvents, or mixtures thereof. As noted above, particular solvents may be employed with particular substrates being coated to result in a surface coating contiguous with the substrate coated.

In still yet another aspect of this invention, a sprayed-on surface coating for a substrate is provided comprising non-entangled multi-walled carbon nanotubes which are substantially free of metal oxides and sulfur. In a preferred embodiment, the sprayed-on surface coating comprises non-entangled multi-walled carbon nanotubes at a density of from about 10 to about 10,000 mg/m$^2$. In a particularly preferred embodiment, the surface coating of this invention comprises non-entangled multi-walled carbon nanotubes at a density of up to 100 mg/m$^2$. In a particularly preferred embodiment, the surface coating of the invention has a surface resistivity of up to $10^5$ Ω/square.

The sprayed-on nanotube coatings of this invention are useful for numerous applications such as EMI shielding or other protective coatings, static control, and the like. Example 3 demonstrates the complex permittivity of substrates coated with the sprayed nanotube compositions of this invention. As is known in the art, permittivity is a property of material that indicates how much polarization occurs when an electric field is applied. Complex permittivity is a property that describes both polarization and absorption of energy. Real permittivity is related to polarization, while imaginary permittivity is related to energy absorption.

EXAMPLE 3

FIGS. 2a and 2b show the real (FIG. 2a) and imaginary (FIG. 2b) permittivity of an acrylonitrile-butadiene-styrene (ABS) polymer matrix coated with the NE-MWNT compositions of the present invention. The compositions of the invention were produced and applied to the ABS matrix as described in Example 2, except that tetrahydrofuran (TNF) was selected as the solvent to allow formation of a surface nanotube coating substantially contiguous with the surface of the ABS matrix. The composition of this invention is compared with a known technology for use in EMI shielding of small electronic devices, specifically a powdered nickel coating. The approximate surface concentration of the NE-MWNT coating is less than 5 mg/m$^2$.

As clearly demonstrated in FIGS. 2a and 2b, the permittivity of the NE-MWNT(35B)-coated material is significantly higher than that of the nickel coating (Ni) over the frequency range 0 to 2000 MHz. This demonstrates that the NE-MWNT coating of the present invention is a more effective EMI shielding material than known coatings used in the art such as nickel coatings, without the associated environmental and polymer recycling deficiencies of metallic coatings.

The ability to control surface resistivity, and thereby control such properties as EMI shielding strength or static control properties, is desirable in many applications. Surface resistivity is a measure of the electrical resistance of the surface of a substrate such as a plastic. Example 4 demonstrates the ability of the methods and compositions of the present invention to control surface resistivity by altering the surface density of the NE-MWNT coating of the invention.

EXAMPLE 4

Figure 3:
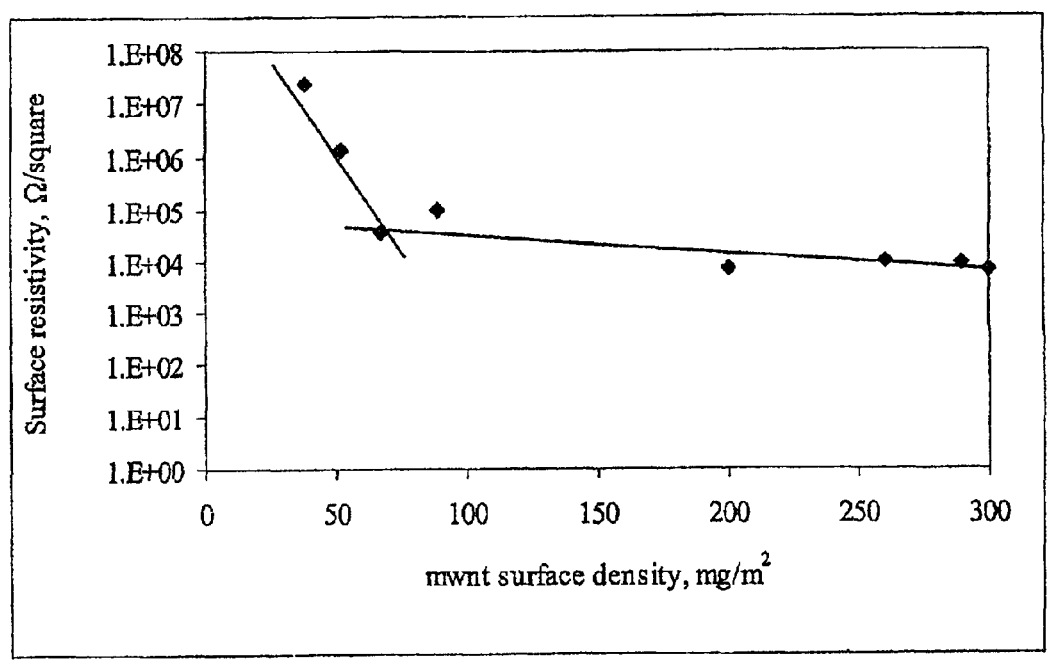
FIG. 3 shows the surface resistivity of an ABS matrix sprayed with the NE-MWNT-containing compositions of this invention at nanotube surface densities of from 0 to 300 mg/m$^2$.

Surface resistivity of an ABS substrate coated with the NE-MWNT compositions of this invention as described in Examples 2 and 3 was determined by measuring an electrical current passing along the surface of the substrate. As seen in FIG. 3, by varying the surface density of the NE-MWNT coating from 0 to 300 mg/m$^2$, surface resistivity of the substrate was varied from $10^{11}$ Ω/square to less than $10^3$ Ω/square. Accordingly, a desired surface resistivity, in accordance with the desired application for the surface or device to be coated with the NE-MWNT-containing compositions of this invention, may be achieved by altering the final nanotube surface density of the coating.

In still yet another aspect of the invention, surface coatings for substrates are provided comprising non-entangled multi-walled carbon nanotubes substantially contiguous with a matrix, wherein the non-entangled multi-walled carbon nanotubes are substantially free of metal oxides and sulfur. In a preferred embodiment, the surface coating comprises non-entangled multi-walled carbon nanotubes at a density of from about 10 to about 10,000 mg/m$^2$. In a particularly preferred embodiment, the surface coating of this invention comprises non-entangled multi-walled carbon nanotubes at a density of up to 100 mg/m$^2$. In a particularly preferred embodiment, the surface coating of the invention has a surface resistivity of up to $10^5$ Ω/square. Suitable matrices may be selected from the group including polymers, glasses, ceramics, metals, or mixtures thereof.

EXAMPLE 5

10 mg of NE-MWNTs, synthesized as described supra, are dispersed by ultrasonication into 100 ml of xylene, and sprayed onto high impact polystyrene. The xylene is then evaporated. The selection of xylene as solvent results in a surface coating of NE-MWNTs which is substantially contiguous with the surface of the high impact polystyrene matrix. Surface resistivity is less than $10^5$ Ω/square. The resulting NE-MWNT-coated high impact polystyrene is suitable for use in electrostatic packaging materials.

EXAMPLE 6

10 mg of NE-MWNTs, synthesized as described supra, are dispersed by ultrasonication into 100 ml of xylene, and sprayed onto polystyrene. The xylene is then evaporated. The selection of xylene as solvent results in a surface coating of NE-MWNTs which is substantially contiguous with the surface of the polystyrene matrix. Surface resistivity is less than $10^5$ Ω/square. The resulting NE-MWNT-coating contiguous with the polystyrene matrix serves as a base or primer coat to allow electrostatic painting.

It will be appreciated that spraying the NE-MWNT-containing compositions of this invention in accordance with the methods described herein onto particular surfaces and under particular conditions may also be used for effecting alignment of nanotubes in the final product. For example, spraying onto a surface which is subjected to a magnetic, electric, or electromagnetic field may be used to align the nanotubes in relation to the substrate on which they are sprayed. Accordingly, this method would allow the production of shaped or molded NE-MWNT composite forms. Further, applying an electrical potential difference between the target surface and the spray apparatus (as is done in current electrostatic painting techniques) may also desirably be used to align the nanotubes in relation to the surface to which they are applied.

As described herein and demonstrated in the foregoing examples, the present invention, providing a method and composition for applying a In thin layer of nanotubes in a carrier solvent to a surface by spraying provides numerous advantages over currently employed technologies. Due to the high aspect ratio of the NE-MWNTs, relatively little nanotube material is required to provide a desired percolation threshold, and hence EMI shielding capability, static control capability, etc. compared to currently used technologies. This high aspect ratio allows less material to be used to achieve better surface coverage and conductivity in the shielded material. The coating of the present invention adds little weight to the finished product. The coating is easily applied, and by choosing the appropriate carrier solvent is made contiguous with, for example, plastic substrates. The nanotube compositions of this invention do not impair recyclability of substrates to which they are applied, and further do not lessen the mechanical properties of the substrates as do current metal particle-based technologies. Advantageously, the present invention provides the further advantage of combining the separation/dispersion of the nanotubes and the coating application into a single step process.

The foregoing description of preferred embodiments of the invention has been presented for purposes of illustration and description. It is not intended to be exhaustive or to limit the invention to the precise form disclosed. Obvious modifications or variations are possible in light of the above teachings. The embodiments were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A method for conferring surface conductivity to a target surface comprising:

simultaneously dispersing non-entangled multi-walled carbon nanotubes in a solvent and applying said non-entangled multi-walled carbon nanotubes dispersed in solvent to the target surface; and evaporating said solvent;

wherein the nanotubes are not treated with an oxidizing agent.

2. The method of claim 1, wherein said non-entangled multi-walled carbon nanotubes and said solvent are substantially free of metal oxide.

3. The method of claim 1, wherein said non-entangled multi-walled carbon nanotubes and said solvent are substantially free of sulfur.

4. The method of claim 1, wherein said non-entangled multi-walled carbon nanotubes and said solvent are substantially free of metal oxide and sulfur.

5. The method of claim 1, wherein said non-entangled multi-walled carbon nanotubes have an aspect ratio of from about 10 to about 50,000.

6. The method of claim 1, wherein said non-entangled multi-walled carbon nanotubes have an aspect ratio of from about 500 to about 10,000.

7. The method of claim 1, wherein said non-entangled multi-walled carbon nanotubes have an aspect ratio of from about 1000 to about 5000.

8. The method of claim 1, wherein said non-entangled multi-walled carbon nanotubes have a diameter of from about 3.5 nanometers to about 200 nanometers.

9. The method of claim 1, wherein said non-entangled multi-walled carbon nanotubes have a diameter of from about 20 nanometers to about 40 nanometers.

10. The method of claim 1, wherein said solvent is selected from the group consisting of polar organic solvents, nonpolar organic solvents, alcohols, polymeric resins, halogen-substituted organic solvents, and mixtures thereof.

11. The method of claim 1, wherein said non-entangled multi-walled carbon nanotubes are dispersed by entrainment in said solvent by passage through an expansion means.

12. The method of claim 1, wherein said non-entangled multi-walled carbon nanotubes are mixed with said solvent, said solvent then being flash-evaporated as it is expanded onto said target surface.

13. The method of claim 1, wherein coating of said target surface with said non-entangled multi-walled carbon nanotubes includes the steps of:

entraining said non-entangled multi-walled carbon nanotubes dispersed in a solvent into a gas carrier stream;

creating an aerosol of said non-entangled multi-walled carbon nanotubes in said gas carrier stream; and spraying said aerosol onto said target surface.

14. The method of claim 13, wherein said gas carrier stream is air.

15. A method for conferring surface conductivity to a target surface comprising:

simultaneously dispersing non-entangled multi-walled carbon nanotubes in a solvent and applying said non-entangled multi-walled carbon nanotubes dispersed in solvent to a matrix to form a substantially contiguous surface coating;

wherein the nanotubes are not treated with an oxidizing agent.

16. The method of claim 15, wherein said non-entangled multi-walled carbon nanotubes, said solvent, and said matrix are substantially free of metal oxide.

17. The method of claim 15, wherein said non-entangled multi-walled carbon nanotubes, said solvent, and said matrix are substantially free of sulfur.

18. The method of claim 15, wherein said non-entangled multi-walled carbon nanotubes, said solvent, and said matrix are substantially free of metal oxide and sulfur.

19. The method of claim 15 wherein said non-entangled multi-walled carbon nanotubes have an aspect ratio of from about 10 to about 50,000.

20. The method of claim 15, wherein said non-entangled multi-walled carbon nanotubes have an aspect ratio of from about 500 to about 10,000.

21. The method of claim 15, wherein said non-entangled multi-walled carbon nanotubes have an aspect ratio of from about 1000 to about 5000.

22. The method of claim 15, wherein said non-entangled multi-walled carbon nanotubes have a diameter of from about 3.5 nanometers to about 200 nanometers.

23. The method of claim 15, wherein said non-entangled multi-walled carbon nanotubes have a diameter of from about 20 nanometers to about 40 nanometers.

24. The method of claim 15, wherein said solvent is selected from the group including polar organic solvents, nonpolar organic solvents, alcohols, polymeric resins, halogen-substituted organic solvents and mixtures thereof.

25. The method of claim 15, wherein said matrix is selected from the group consisting of polymers, glasses, ceramics, metals and mixtures thereof.

* * * * *